(12) United States Patent
Won et al.

(10) Patent No.: US 6,216,240 B1
(45) Date of Patent: Apr. 10, 2001

(54) MERGED MEMORY AND LOGIC (MML) INTEGRATED CIRCUITS INCLUDING MEMORY TEST CONTROLLING CIRCUITS AND METHODS

(75) Inventors: Jong-hak Won; Sang-bong Park, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/059,787

(22) Filed: Apr. 14, 1998

(30) Foreign Application Priority Data

Jun. 26, 1997 (KR) .............................. 1997-27603
Jul. 7, 1997 (KR) .............................. 1997-31321

(51) Int. Cl.[7] .................................................. G11C 29/00
(52) U.S. Cl. ...................... 714/718; 365/189.02; 365/201
(58) Field of Search ..................... 714/719, 718, 714/717; 395/425; 365/189.02, 230.03

(56) References Cited

U.S. PATENT DOCUMENTS

| 5,043,874 | * | 8/1991 | Gagliardo et al. | 364/200 |
| 5,124,589 | * | 6/1992 | Shiomi et al. | 307/465 |
| 5,504,706 | * | 4/1996 | D'Arrigo et al. | 365/185.18 |
| 5,535,165 | * | 7/1996 | Davis et al. | 365/201 |
| 5,598,573 | * | 1/1997 | Hall et al. | 395/800 |
| 5,805,854 | * | 9/1998 | Shigeeda | 395/401 |
| 5,926,420 | * | 7/1999 | Kim | 365/189.02 |

FOREIGN PATENT DOCUMENTS

| 0 801 400 A1 | 10/1997 | (EP) | G11C/29/00 |
| 0 801 401 A1 | 10/1997 | (EP) | G11C/29/00 |
| WO 98/12707 | 3/1998 | (WO) | G11C/29/00 |

\* cited by examiner

Primary Examiner—Albert DeCady
Assistant Examiner—Guy Lamarre
(74) Attorney, Agent, or Firm—Myers Bigel Sibley & Sajovec

(57) ABSTRACT

A memory test control circuit in an MML integrated circuit is connected to a first pad which receives memory control signals to control first and second memories of the MML circuit. The memory test control circuit is also connected to a second pad which receives memory data signals for the first and second memories. The memory test control circuit is also connected to the logic block and to the first and second memories. The memory test control circuit transmits the memory control signals and the memory data signals to the first and second memories when the first and second memories are tested and transmits the memory control signals and the memory data signals to the logic block during normal operation of the MML integrated circuit. Accordingly, the memory test control circuit allows pass-through of memory data and control signals directly to the memory blocks during test mode, and provides the memory data and control signals to the logic block during normal operations.

33 Claims, 7 Drawing Sheets

MERGED MEMORY AND LOGIC (MML) INTEGRATED CIRCUITS INCLUDING MEMORY TEST CONTROLLING CIRCUITS AND METHODS

FIELD OF THE INVENTION

This invention relates to integrated circuit devices, and more particularly to testing of integrated circuit devices.

BACKGROUND OF THE INVENTION

Integrated circuit devices, such as integrated circuit memory devices and integrated circuit logic devices, are widely used in consumer and commercial applications.

Recently, merged memory and logic (MML) integrated circuits have been developed. MML integrated circuits generally include a large capacity memory and a large logic block that are merged in one integrated circuit. The large capacity memory is generally divided into a plurality of memory blocks, also referred to as "memories". The logic block may also be referred to as a "logic circuit" or simply as a "logic". Thus, an MML integrated circuit can replace discrete memory and logic chips that are used in personal computers and other consumer and commercial devices.

MML integrated circuits present new challenges for the testing thereof. In particular, the MML integrated circuit generally provides a large number of internal data pads between the memory block and the logic block. For example, up to 256 or more internal pads may be provided. Since many of these internal pads are not brought out to external MML integrated circuit pads, it may be difficult to access all of the internal data pads in order to test the memory block.

Stated differently, in order to test a conventional memory integrated circuit, test equipment is connected to the pads of the memory integrated circuit. However, the memory block in an MML integrated circuit may be difficult to test because the memory is connected to the external pads through the logic block. Accordingly, additional pads may be needed to test the memory of the MML integrated circuit. Unfortunately, the addition of large numbers of test pads may increase the cost, size and/or complexity of the MML integrated circuit.

SUMMARY OF THE INVENTION

It is therefore an object of the present invention to provide improved testing circuits and methods for MML integrated circuits.

It is another object of the present invention to provide testing methods and circuits for MML integrated circuits that can reduce the number of additional pads that are used for memory testing.

These and other objects are provided, according to the present invention, by providing a memory test control circuit in an MML integrated circuit. The memory test control circuit is connected to a first pad which receives memory control signals to control first and second memories of the MML circuit. The memory test control circuit is also connected to a second pad which receives memory data signals for the first and second memories. The memory test control circuit is also connected to the logic block and to the first and second memories. The memory test control circuit transmits the memory control signals and the memory data signals to the first and second memories when the first and second memories are tested and transmits the memory control signals and the memory data signals to the logic block during normal operation of the MML integrated circuit. Accordingly, the memory test control circuit allows passthrough of memory data and control signals directly to the memory blocks during test mode, and provides the memory data and control signals to the logic block during normal operations.

In a preferred embodiment of the present invention, the memory test control circuit includes means for generating a first control signal to indicate a test of a first one of the memory blocks, for generating a second control signal to indicate a test of the second one of the plurality of memory blocks, and for generating a third control signal to indicate the normal operation mode for the MML integrated circuit, in response to the test control signal. First means for controlling the first and second memory blocks and the logic block is provided. The first means transmits the memory control signals from the first pad to the first memory block in response to the first control signal, transmits the memory control signals from the first pad to the second memory block in response to the second control signal and transmits the memory control signals from the first pad to the logic block in response to the third control signal. Second means for controlling the first and second memory blocks and the logic block is also provided. The second means transmits the memory data signals from the second pad to the first memory block in response to the first control signal, transmits the memory data signals from the second pad to the second memory block in response to the second control signal and transmits the memory data signals from the second pad to the logic block in response to the third control signal. Analogous methods of operating MML integrated circuits are also provided.

The memory test control circuit may include a memory control signal controller that transmits the memory control signals from the first pads to the first and second memories and to the logic block. The memory data controller transmits the memory data signals from the second pad to the first and second memories and transmits memory data signals generated from the first and second memories and the logic block to the second pad. A main control signal generator is connected to the memory control signal controller and to the memory data controller. The main control signal generator generates main control signals to control transmission of the memory control signals to the first and second memories and to the logic block in response to a test control signal, to control transmission of the memory data signals to the first and second memories and the logic block and to control transmission of the memory data signals generated from the first and second memories and the logic block to the second pad. Preferred embodiments of the memory control signal controller, the memory data controller and the main control signal generator are also provided. Accordingly, testing of memory blocks in an MML integrated circuit may be accomplished without the need to add large numbers of pads to the MML integrated circuit for internal access to the memory blocks.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
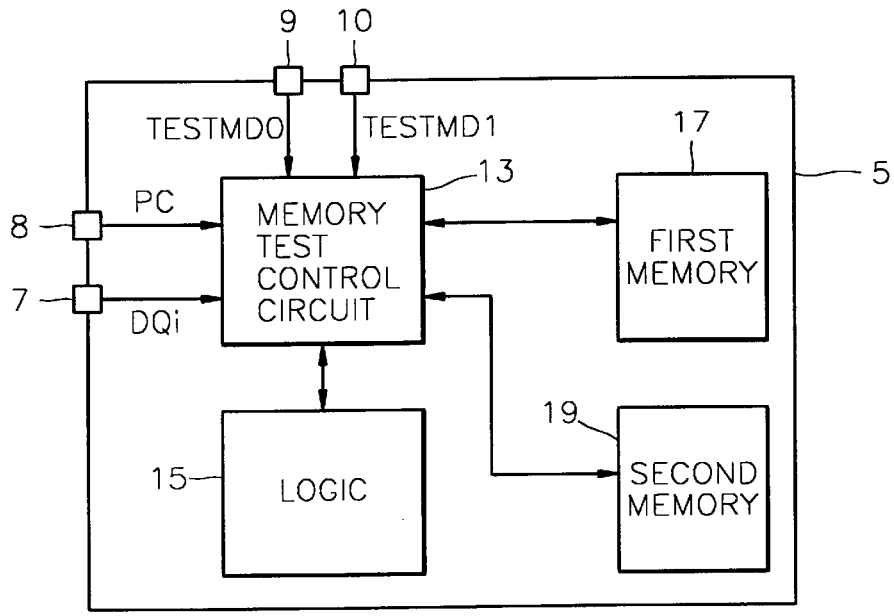
FIG. 1 is a block diagram of a merged memory and logic (MML) integrated circuit according to a first embodiment of the present invention.

FIG. 1 is a block diagram of a merged memory and logic (MML) integrated circuit according to a preferred embodiment of the present invention. Referring to FIG. 1, the MML integrated circuit 5 includes pads 7, 8, 9 and 10, a memory test control circuit 13, a logic block 15 (also referred to herein as a logic or a logic circuit) and first and second memory blocks (also referred to herein as memories).

The memory test control circuit 13 is connected to the pads 7, 8, 9 and 10, and the logic 15. The first and second memories 17 and 19, e.g., DRAM banks, are also connected to the memory test control circuit 13.

A memory control signal PC for controlling the first and second memories 17 and 19 is applied to the first pad 8, and test control signals TESTMD0 and TESTMD1 for controlling the memory test control circuit 13 are applied to the pads 9 and 10. Also, a memory data signal DQi is input/output to the first and second memories 17 and 19 is applied to the second pad 7. The pads 7 and 8 preferably are existing pads for using the first and second memories 17 and 19, and the pads 9 and 10 may be added pads to control the memory test control circuit 13.

A memory tester is connected to the pads 7, 8, 9 and 10 to test functions of the first and second memories 17 and 19 of the MML device 5. The memory tester inputs the memory control signal PC and the memory data signal DQi to the memory test control circuit 13 through the pads 7 and 8. Also, the memory test control circuit 13 is controlled by a combination of the test control signals TESTMD0 and TESTMD1. Accordingly, in the testing of the first and second memories 17 and 19, the memory test control circuit 13 applies the memory control signal PC and the memory data signal DQi to the first and second memories 17 and 19. The first and second memories 17 and 19 operate by the memory control signal PC and the memory data signal DQi, and then the result is transmitted to the memory test control circuit 13. The memory test control circuit 13 transmits signals from the first and second memories 17 and 19 to the memory tester through the pads 7 and 8. Accordingly, the memory tester can analyze signals transmitted through the pads 7 and 8 to evaluate the functions of the first and second memories 17 and 19.

When the MML 5 operates normally without testing the first and second memories 17 and 19, the memory test control circuit 13 is partially disabled due to the combination of test control signals TESTMD0 and TESTMD1. When the memory control signal PC and the memory data signals DQis are applied externally to perform normal operation of the MML 5, the applied signals are input to the logic 15, which controls the first and second memories 17 and 19 through the memory test control circuit 13.

The embodiment of the present invention illustrated in FIG. 1 is employed for a merged memory logic device having two memories, however, the invention may be employed for a merged memory logic semiconductor device having one or more memories. Moreover, the number of pads that are used can vary.

As described above, a merged memory logic semiconductor device 5 according to an embodiment of the present invention may test the first and second memories 17 and 19 using the conventional pads 7 and 8.

Figure 2:
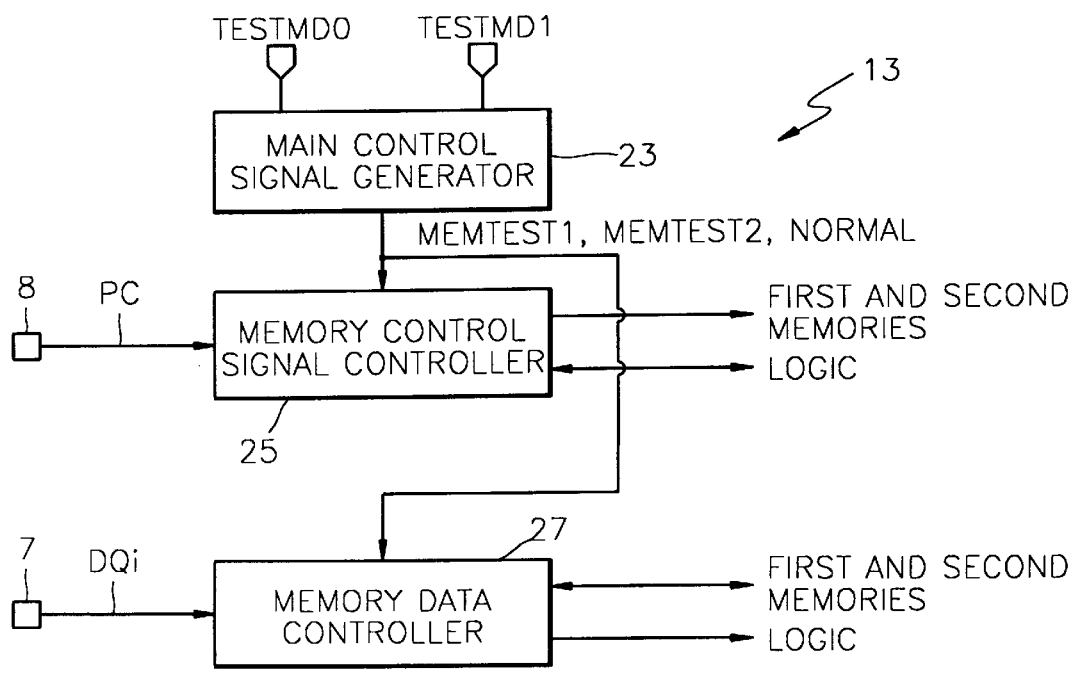
FIG. 2 is a block diagram according to the first embodiment of a memory test control circuit of FIG. 1.

FIG. 2 is a block diagram of a memory test control circuit 13 of FIG. 1 according to a first embodiment. Referring to FIG. 2, the memory test control circuit 13 according to the first embodiment includes a main control signal generator 23, a memory control signal controller 25 and a memory data controller 27.

In the main control signal generator 23, the test control signals TESTMD0 and TESTMD1 are applied to an input terminal, and an output terminal is connected to the memory control signal controller 25 and the memory data controller 27. The main control signal generator 23 generates main control signals MEMTEST1, MEMTEST2 and NORMAL, in response to the test control signals TESTMD0 and TESTMD1. For example, the main control signal generator 23 has truth values as shown in Table 1.

TABLE 1

| Function | TESTMD0 | TESTMD1 | Main control signal |
| --- | --- | --- | --- |
| First memory test | 'L' | 'L' | MEMTEST1 |
| Second memory test | 'H' | 'L' | MEMTEST2 |
| Normal operation | 'L' | 'H' | NORMAL |
|  | 'H' | 'H' | Hold present state |

As shown in Table 1, when the test control signals TESTMD0 and TESTMD1 are logic low 'L', the main control signal MEMTEST1 is made active to test the first memory 17 of FIG. 1, and when the test control signal TESTMD0 is activated to logic high 'H' and the test control signal TESTMD1 is logic low 'L', the main control signal MEMTEST2 is active to test the second memory 19 of FIG. 1. Also, when the test control signal TESTMD0 is logic low 'L' and the test control signal TESTMD1 is logic high 'H', a signal NORMAL is active to normally operate the logic 15 of FIG. 1. When the test control signals TESTMD0 and TESTMD1 are logic high 'H', the previous state is maintained.

The memory control signal controller 25 receives the memory control signal PC applied through the pad 8, and is controlled by the main control signals MEMTEST1, MEMTEST2 and NORMAL to transmit the memory control signal PC to the first and second memories 17 and 19 of FIG. 1 and to the logic 15 of FIG. 1. The memory control signal PC includes a row address strobe signal RASB, a column address strobe signal CASB, a write enable signal WEB, an output enable signal OEB, and an address signal Ai.

The memory data controller 27 receives the memory data signal DQi applied through the pad 7, and is controlled by the main control signals MEMTEST1, MEMTEST2 and NORMAL to transmit the memory data signal DQi input externally to the first and second memories 17 and 19 of FIG. 1 or the logic 15 of FIG. 1, and to transmit the memory data signal DQi generated from the first and second memories 17 and 19 of FIG. 1 or the logic 15 of FIG. 1 to the pad 7.

As described above, the memory test control circuit 13 according to the first embodiment of the present invention may test the first and second memories 17 and 19 of FIG. 1 using the conventional pads 7 and 8 of FIG. 1 without the logic 15.

Figure 3:
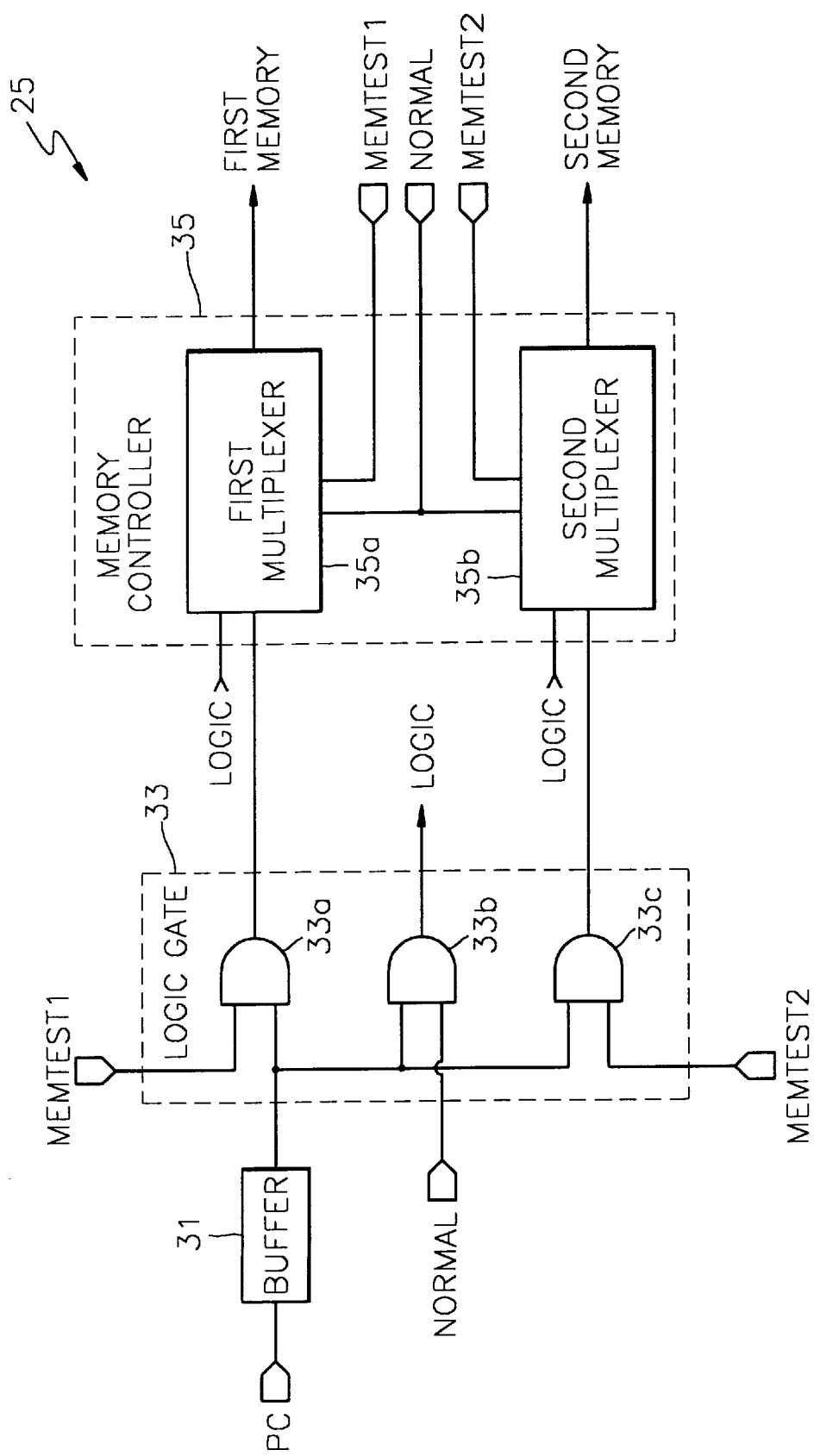
FIG. 3 is a circuit diagram of a memory control signal controller of FIG. 2.

FIG. 3 is a circuit diagram of a memory control signal controller 25 of FIG. 2. Referring to FIG. 3, the memory control signal controller 25 includes a buffer 31, a logic gate 33 and a memory controller 35.

The buffer 31 receives a memory control signal PC, and transmits the output to the logic gate 33. The buffer 31 changes the voltage level of the memory control signal PC. For example, a voltage of a transistor transistor logic (TTL) level is converted into a voltage of a complementary metal oxide semiconductor (CMOS) level.

The logic gate 33 receives an output of the buffer 31, and transmits the output to the memory controller 35. The logic gate 33 includes first through third AND gates 33a, 33b and 33c.

The first AND gate 33a receives the output of the buffer 31 and the main control signal MEMTEST1. When the output of the buffer 31 or the main control signal MEMTEST1 is logic low, the first AND gate 33a generates a logic low signal, and when the output of the buffer 31 and the main control signal MEMTEST1 are logic high, the first AND gate 33a generates a logic high signal.

The second AND gate 33b receives the output of the buffer 31 and the main control signal NORMAL and transmits the output to the logic 15 of FIG. 1. When the output of the buffer 31 or the main control signal NORMAL is logic low, the second AND gate 33b generates a logic low signal, and when the output of the buffer 31 and the main control signal NORMAL are logic high, the second AND gate 33b generates a logic high signal.

The third AND gate 33c receives the output of the buffer 31 and the main control signal MEMTEST2. When the output of the buffer 31 or the main control signal MEMTEST2 is logic low, the third AND gate 33b generates a logic low signal, and when the output of the buffer 31 and the main control signal MEMTEST2 are logic low, the third AND gate 33c generates a logic high signal.

The memory controller 35 includes first and second multiplexers 35a and 35b.

A 2-input, 1-output multiplexer is used as the first multiplexer 35a. The first multiplexer 35a receives the output of the first AND gate 33a and the output of the logic 15 of FIG. 1, and is controlled by the main control signals NORMAL and MEMTEST1, to transmit the output of the first AND gate 33a and the output of the logic 15 of FIG. 1 to the first memory 17 of FIG. 1. That is, when the main control signal NORMAL is active, the first multiplexer 35a transmits signals generated from the logic 15 of FIG. 1 to the first memory 17 of FIG. 1, and when the main control signal MEMTEST1 is active, the first multiplexer 35a transmits the signals generated from the first AND gate 33a to the first memory 17 of FIG. 1.

A 2-input, 1-output multiplexer is used as the second multiplexer 35b. The second multiplexer 35b receives the output of the third AND gate 33c and the output of the logic 15 of FIG. 1, and is controlled by the main control signals NORMAL and MEMTEST2, to transmit the output of the third AND gate 33c and the output of the logic 15 of FIG. 1 to the second memory 19 of FIG. 1. That is, when the main control signal NORMAL is active, the second multiplexer 35b transmits the signals generated from the logic 15 of FIG. 1 to the second memory 19 of FIG. 1, and when the main control signal MEMTEST2 is active, the second multiplexer 35b transmits the signal generated from the third AND gate 33c to the second memory 19 of FIG. 1.

Figure 4:
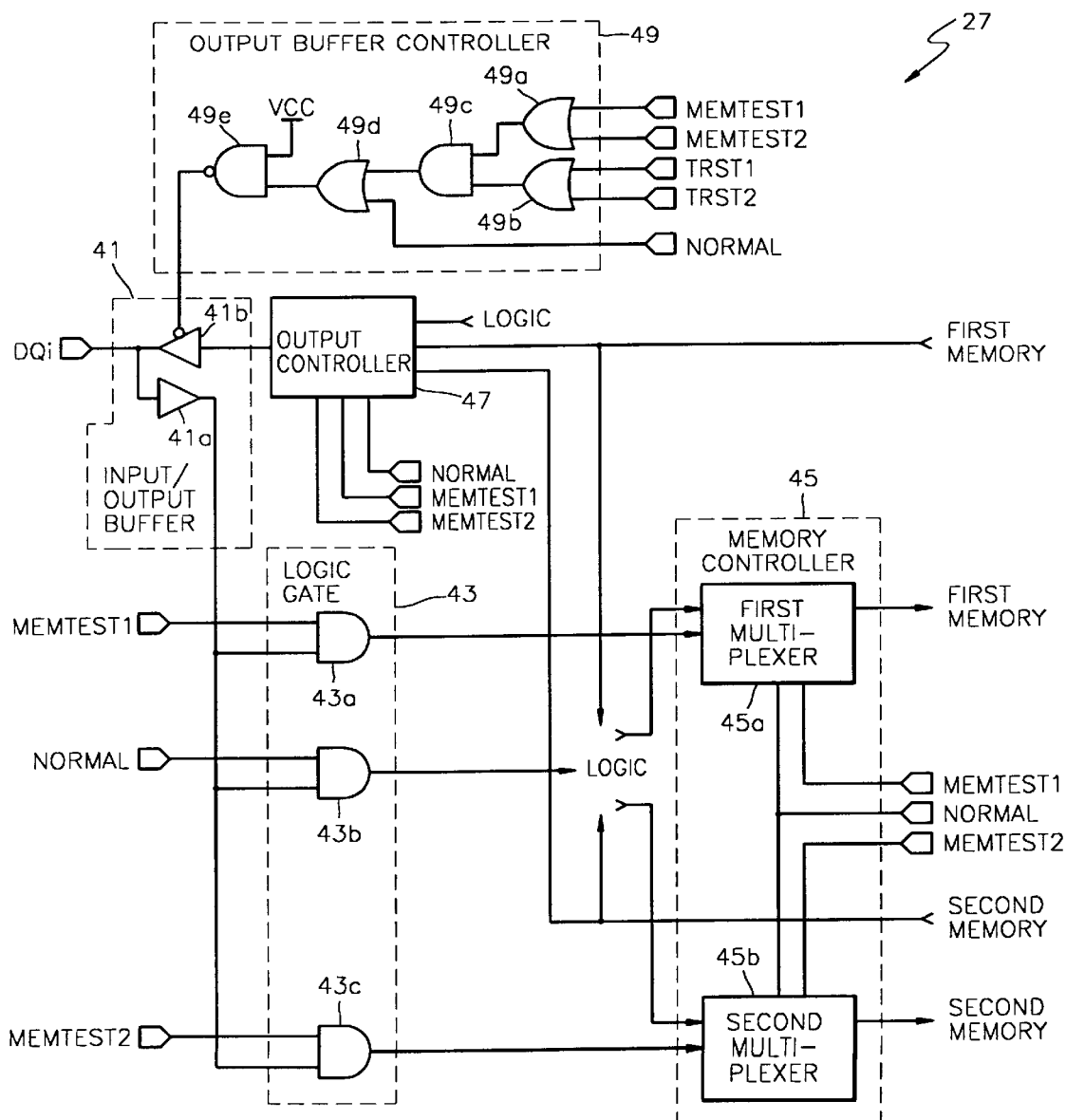
FIG. 4 is a circuit diagram of a memory data controller of FIG. 2.

FIG. 4 is a circuit diagram of the memory data controller 27 of FIG. 2. Referring to FIG. 4, the memory data controller 27 includes an input/output buffer 41, a logic gate 43, a memory controller 45, an output controller 47 and an output buffer controller 49.

The input/output buffer 41 includes an input buffer 41a and an output buffer 41b.

The input buffer 41a receives the memory data signal DQi, and transmits the output to the logic gate 43. The input buffer 41a changes the voltage level of the memory data signal DQi. For example, a voltage of a TTL level is converted to a voltage of a CMOS level.

The output buffer 41b is controlled by the output buffer controller 49 to transmit the output of the output controller 47 externally. That is, when output of the output buffer controller 49 is active, the output buffer 41b is activated to transmit the output of the output controller 47 externally, and when the output of the output buffer controller 49 is inactive, the output buffer 41b is inactive to prevent transmission of the output of the output controller 47 externally.

The logic gate 43 receives the output of the input buffer 41a and signals MEMTEST1, NORMAL and MEMTEST2, and transmits the output to the memory controller 45. The logic gate 43 includes first through third AND gates 43a, 43b and 43c.

The first AND gate 43a receives the output of the input buffer 41a and the main control signal MEMTEST1, and transmits the output to the memory controller 45. When the output of the input buffer 41a or the main control signal MEMTEST1 is logic low, the first AND gate 43a generates a logic low signal, and when the output of the input buffer 41a and the main control signal MEMTEST1 are logic high, the first AND gate 43a generates a logic high signal.

The second AND gate 43b receives the output of the input buffer 41a and the main control signal NORMAL, and transmits the output to the logic 15 of FIG. 1. When the output of the input buffer 41a or the main control signal NORMAL is logic low, the second AND gate 43b generates signals of logic low, and when the output of the input buffer 41a and the main control signal NORMAL are logic high, the second AND gate 43b generates a logic high signal.

The third AND gate 43c receives the output of the input buffer 41a and the main control signal MEMTEST2, and transmits the output to the memory controller 45. When the output of the input buffer 41a or the main control signal MEMTEST2 is logic low, the third AND gate 43c generates a logic low signal, and when the output of the input buffer 41a and the main control signal MEMTEST2 are logic high, the third AND gate 43c generates a logic high signal.

The memory controller 45 includes first and second multiplexers 45a and 45b.

A 2-input, 1-output multiplexer is used as the first multiplexer 45a. The first multiplexer 45a receives the output of the first AND gate 43a and the output of the logic 15 of FIG. 1, and is controlled by the main control signals NORMAL and MEMTEST1, to transmit the output of the first AND gate 43a and the output of the logic 15 of FIG. 1 to the first memory 17 of FIG. 1. That is, when the main control signal NORMAL is active, the first multiplexer 45a transmits signals generated from the logic 15 of FIG. 1 to the first memory 17 of FIG. 1, and when the main control signal MEMTEST1 is active, the first multiplexer 45a transmits signals generated from the first AND gate 43a to the first memory 17 of FIG. 1.

A 2-input, 1-output multiplexer is used as the second multiplexer 45b. The second multiplexer 45b receives the output of the third AND gate 43c and the output of the logic 15 of FIG. 1, and is controlled by the main control signals NORMAL and MEMTEST2, to transmit the output of the third AND gate 43c and the output of the logic 15 of FIG. 1 to the second memory 19 of FIG. 1. That is, when the main control signal NORMAL is active, the second multiplexer 45b transmits signals generated from the logic 15 of FIG. 1 to the second memory 19 of FIG. 1, and when the main control signal MEMTEST2 is active, the second multiplexer 45b transmits signals generated from the third AND gate 43c to the second memory 19 of FIG. 1.

The output controller 47 receives signals generated from the logic 15 of FIG. 1 and the first and second memories 17 and 19 of FIG. 1, and transmits the output to the output buffer 41b. A 3-input, 1-output multiplexer is used as the output controller 47. The output controller 47 is controlled by the main control signals NORMAL, MEMTEST1 and MEMTEST2. That is, when the main control signal NORMAL is active, the output controller 47 transmits signals generated from the logic 15 of FIG. 1 output controller 47 transmits signals from the first memory 17 of FIG. 1 to the output buffer 41b, and when the main control signal MEMTEST2 is active, the output controller 47 transmits signals generated from the second memory 19 of FIG. 1 to the output buffer 41b.

The output buffer controller 49 includes first through third logic gates 49a, 49b and 49d, a fourth AND gate 49c and a NAND gate 49e.

The first logic gate 49a receives the main control signals MEMTEST1 and MEMTEST2. When one of the main control signals MEMTEST1 and MEMTEST2 is logic high, the first logic gate 49a generates a logic high signal, and when all of the main control signals MEMTEST1 and MEMTEST2 are logic low, the first logic gate 49a generates a logic low signal.

The second logic gate 49b receives a first output buffer enable signal TRST1 generated from the first memory 17 of FIG. 1 and a second output buffer enable signal TRST2 generated from the second memory 19 of FIG. 1. When the first output buffer enable signal TRST1 or the second output buffer enable signal TRST2 is logic high, the second logic gate 49b generates a logic high signal, and when both the first output buffer enable signal TRST1 and the second output buffer enable signal TRST2 are logic low, the second logic gate 49b generates a logic low signal.

The fourth AND gate 49c receives the output of the first logic gate 49a and the output of the second logic gate 49b. When the output of the first logic gate 49a or the output of the second logic gate 49b is logic low, the fourth AND gate generates a logic low signal, and both the output of the first logic gate 49a and the output of the second logic gate 49b are logic high, the fourth AND gate generates a logic high signal.

The third logic gate 49d receives the output of the fourth AND gate 49c and the main control signal NORMAL. When the output of the fourth AND gate 49c or the main control signal is logic high, the third logic gate 49d generates a logic high signal, and both the output of the fourth AND gate 49c and the main control signal are logic low, the third logic gate 49d generates a logic low signal.

The NAND gate 49e receives the output of the third logic gate 49d and a power supply voltage VCC, and transmits the output to a control terminal of the output buffer 41b. The NAND gate 49e transmits the output of the third logic gate 49d to the control terminal of the output buffer 41b. That is, when the output of the third logic gate 49d is logic high, the NAND gate 49e generates a logic low signal, and when the output of the third logic gate 49d is logic low, the NAND gate 49e generates a logic high signal. When the output of the NAND gate 49e is logic low, i.e., active, the output buffer 41b is activated, and when the output of the NAND gate 49e is logic high, i.e., inactive, the output buffer 41b is deactivated.

Figure 5:
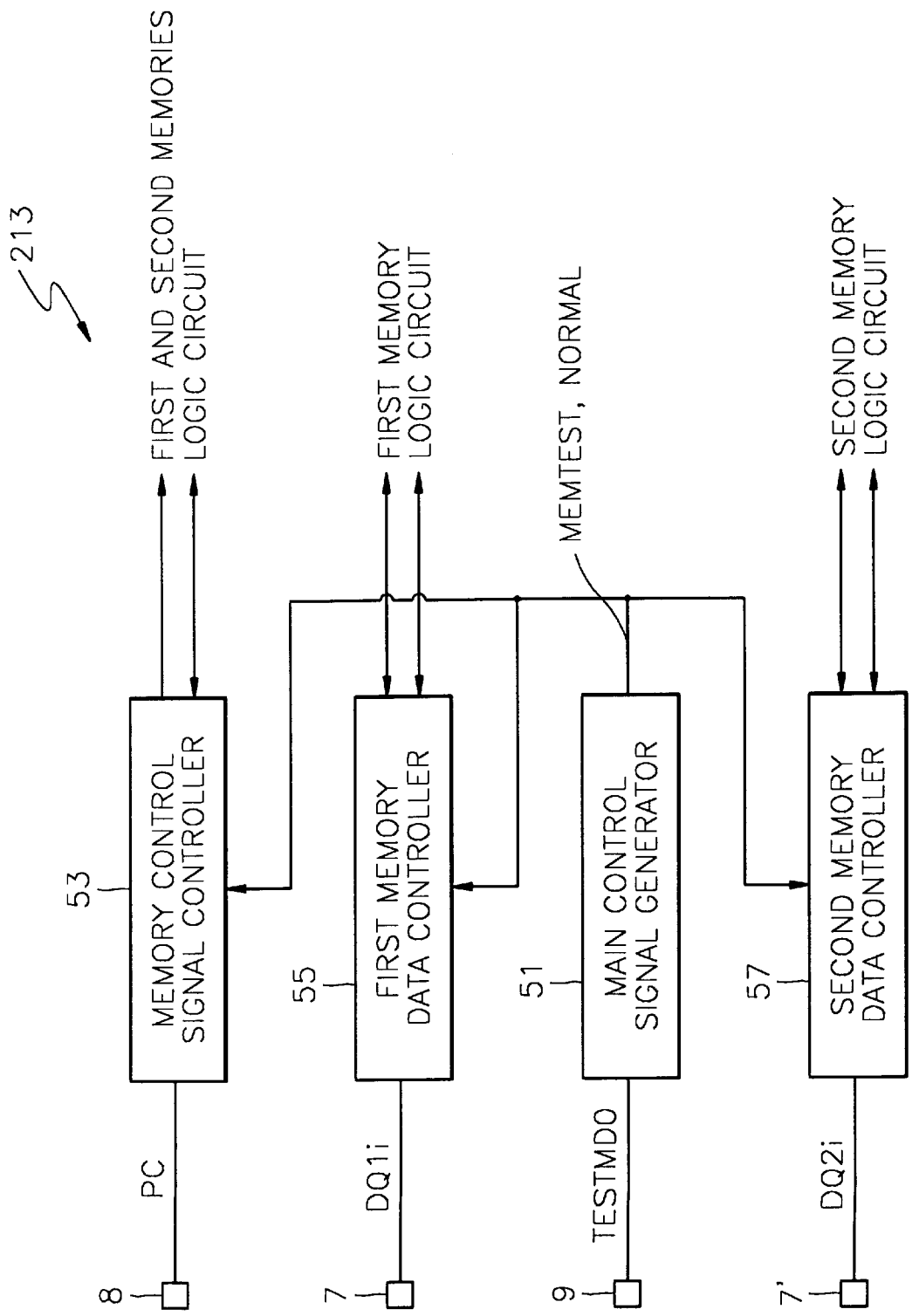
FIG. 5 is a block diagram according to a second embodiment of a memory test control circuit of FIG. 1.

FIG. 5 is a block diagram of a second embodiment of the memory test control circuit of FIG. 1. Referring to FIG. 5, the memory test control circuit 13 according to the second embodiment includes a main control signal generator 51, a memory control signal controller 53, a first memory data controller 55 and a second memory data controller 57.

The main control signal generator 51 receives a test control signal TESTMD0 applied through the pad 9, and transmits the output to the memory control signal controller 53, the first memory data controller 55 and the second memory data controller 57. The main control signal generator 51 generates main control signals, i.e., a main control signal MEMTEST and a main control signal NORMAL, in response to the test control signal TESTMD0. For example, the main control signal generator 51 has truth values as shown in Table 2.

TABLE 2

| Function | TESTMD0 | Main control signal |
| --- | --- | --- |
| First and second memory test | 'L' | MEMTEST |
| Normal operation | 'H' | NORMAL |

As shown in Table 2, when the test control signal TESTMD0 is logic low, the main control signal MEMTEST is active, to test the first and second memories 17 and 19 of FIG. 1, and when the test control signal TESTMD0 is logic high 'H', the main control signal NORMAL is activated, to normally operate the logic 15 of FIG. 1.

The memory control signal controller 53 receives a memory control signal PC applied through the pad 8, and is controlled by the main control signals MEMTEST and NORMAL, to transmit the memory control signal PC to the first and second memories 17 and 19 of FIG. 1 or the logic 15 of FIG. 1. The memory control signal PC includes a row address strobe signal RASB, a column address strobe signal CASB, a write enable signal WEB, an output enable signal OEB and an address signal Ai.

The first memory data controller 55 receives memory data signals DQ1i applied through the pad 7, and is controlled by the main control signals MEMTEST and NORMAL to transmit the memory data signal DQ1i to the first memory 17 of FIG. 1 or the logic 15 of FIG. 1, and the memory data signal DQ1i generated from the first memory 17 of FIG. 1 or the logic 15 of FIG. 1 to outside the pad 7.

The second memory data controller 57 receives a memory data signal DQ2i applied through the pad 7', and is controlled by the main control signals MEMTEST and NORMAL, to transmit the memory data signal DQ2i to the second memory 19 of FIG. 1 or the logic 15 of FIG. 1, and the memory data signal DQ2i generated from the second memory 19 of FIG. 1 or the logic 15 of FIG. 1 to the pad 7'.

As described above, the memory test control circuit 13 according to the second embodiment of the present invention can test the first and second memories 17 and 19 of FIG. 1 using conventional pads 7, 8 and 7' without the logic 15 of FIG. 1.

Figure 6:
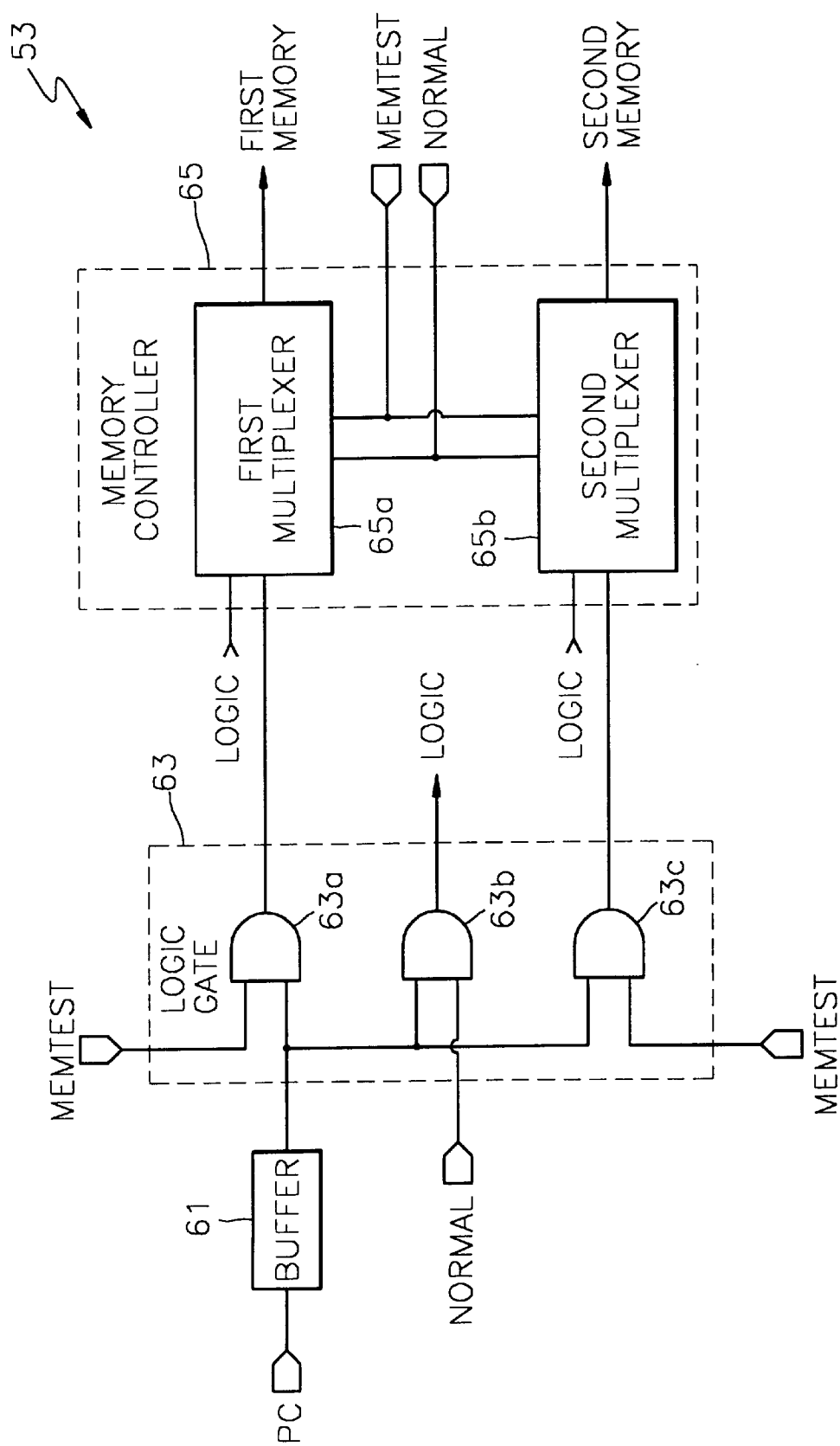
FIG. 6 is a circuit diagram of a memory control signal controller of FIG. 5.

FIG. 6 is a circuit diagram of the memory control signal controller 53 of FIG. 5. Referring to FIG. 6, the memory control signal controller 53 includes a buffer 61, a logic gate 63 and a memory controller 65.

The buffer 61 receives a memory control signal PC, and transmits the output to the logic gate 63. The buffer 61 changes the voltage level of the memory control signal PC. For example, a voltage of a TTL level is converted to a voltage of a CMOS level.

The logic gate 63 receives the output of the buffer 61, and transmits the output to the memory controller 65. The logic gate 63 includes first through third AND gates 63a, 63b and 63c.

The first AND gate 63a receives the output of the buffer 61 and the main control signal MEMTEST. When the output of the buffer 61 or the main control signal MEMTEST is logic low, the first AND gate 63a generates a logic low signal, and when the output of the buffer 61 and the main control signal MEMTEST are logic high, the first AND gate 63a generates a logic high signal.

The second AND gate 63b receives the output of the buffer 61 and the main control signal NORMAL and transmits the output to the logic 15 of FIG. 1. When the output of the buffer 61 or the main control signal NORMAL is logic low, the second AND gate 63b generates a logic low signal, and when the output of the buffer 61 and the main control signal NORMAL are logic high, the second AND gate 63b generates a logic high signal.

The third AND gate 63c receives the output of the buffer 61 and the main control signal MEMTEST. When the output of the buffer 61 or the main control signal MEMTEST are logic high, the third AND gate 63c generates a logic high signal.

The memory controller 65 includes first and second multiplexers 65a and 65b.

A 2-input, 1-output multiplexer is used as the first multiplexer 65a. The first multiplexer 65a receives the output of the first AND gate 63a and the output of the logic 15 of FIG. 1, and is controlled by the main control signals NORMAL and MEMTEST to transmit the output of the first AND gate 63a and the output of the logic 15 of FIG. 1 to the first memory 17 of FIG. 1. That is, when the main control signal NORMAL is active, the first multiplexer 65a transmits the signal generated from the logic 15 of FIG. 1 to the first memory 17 of FIG. 1, and when the main control signal MEMTEST is active, the first multiplexer 65a transmits the signal generated from the first AND gate 63a to the first memory 17 of FIG. 1.

A 2-input, 1-output multiplexer is used as the second multiplexer 65b. The second multiplexer 65b receives the output of the third AND gate 63c and the output of the logic 15 of FIG. 1, and is controlled by the main control signals NORMAL and MEMTEST, to transmit the output of the third AND gate 63c and the output of the logic 15 of FIG. 1 to the second memory 19 of FIG. 1. That is, when the main control signal NORMAL is active, the second multiplexer 65b transmits a signal generated from the logic to the second memory 19 of FIG. 1, and when the main control signal MEMTEST is active, the second multiplexer 65b transmits the signal generated from the third AND gate 63c to the second memory 19 of FIG. 1.

Figure 7:
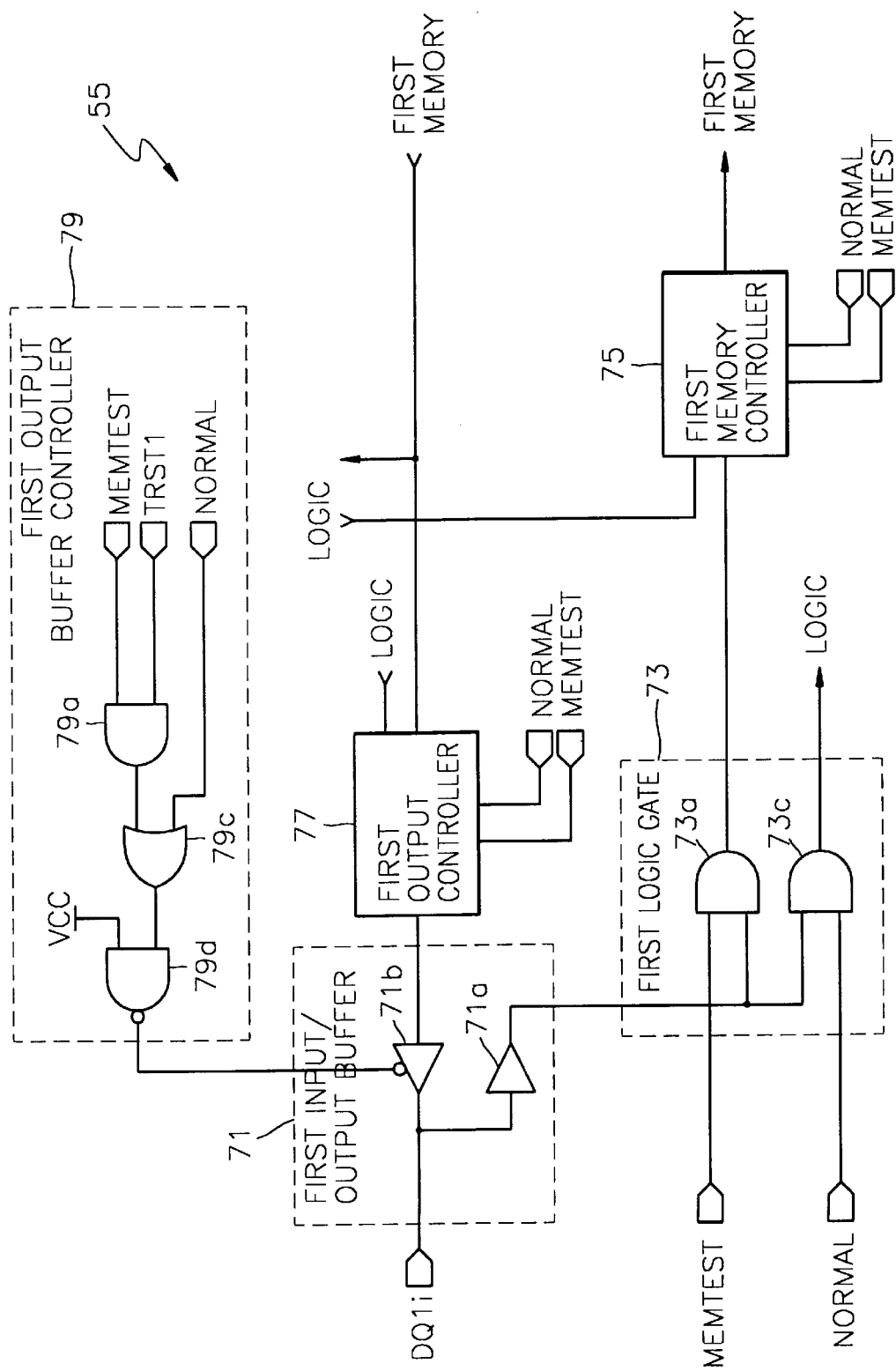
FIG. 7 is a circuit diagram of a first memory data controller of FIG. 5.

FIG. 7 is a circuit diagram of the first memory data controller 55 of FIG. 5. Referring to FIG. 7, the first memory data controller 55 includes a first input/output buffer 71, a first logic gate 73, a first memory controller 75, a first output controller 77 and a first output buffer controller 79.

The first input/output buffer 71 includes the first input buffer 71a and the first output buffer 71b.

The first input buffer 71a receives the memory data signal DQ1i and transmits the output to the first logic gate 73. The first input buffer 71a changes the voltage level of the memory data signal DQ1i. For example, a voltage of the TTL level is converted to a voltage of the CMOS level.

The first output buffer 71b is controlled by the first output buffer controller 79 to transmit the output of the first output controller 77 externally. That is, when the output of the first output buffer controller 77 is active, the first output buffer 71b is activated to transmit the output of the first output controller 77 externally, and when the output of the first output buffer controller 79 is inactive, the first output buffer 71b is inactive to transmit the output of the first output controller 77 externally.

The first logic gate 73 receives the output of the first input buffer 71a and transmits the output to the first memory controller 75. The first logic gate 73 includes first and second AND gates 73a and 73c.

The first AND gate 73a receives the output of the first input buffer 71a and the main control signal MEMTEST. When the output of the first input buffer 71a or the main control signal MEMTEST is logic low, the first AND gate 73a generates a logic low signal, and when the output of the first input buffer 71a and the main control signal MEMTEST are logic high, the first AND gate 73a generates a logic high signal.

The second AND gate 73c receives the output of the first input buffer 71a and the main control signal NORMAL and transmits the output to the logic 15 of FIG. 1. When the output of the first input buffer 71a or the main control signal NORMAL is logic low, the second AND gate 73c generates a logic low signal, and when the output of the first input buffer 71a and the main control signal NORMAL are logic high, the second AND gate 73c generates a logic high signal.

The first memory controller 75 includes a 2-input, 1-output multiplexer. The first memory controller 75 receives the output of the first AND gate 73a and the output of the logic 15 of FIG. 1, and is controlled by the main control signals NORMAL and MEMTEST to transmit the output of the first AND gate 73a and the output of the logic 15 of FIG. 1 to the first memory 17 of FIG. 1. That is, when the main control signal NORMAL is active, the first memory controller 75 transmits signals generated from the logic 15 of FIG. 1 to the first memory 17 of FIG. 1, and when the main control signal MEMTEST is active, the first memory controller 75 transmits signals generated from the first AND gate 73a to the first memory 17 of FIG. 1.

The first output controller 77 includes a 2-input, 1-output multiplexer. The second output controller 77 receives signals generated from the logic 15 of FIG. 1 and the first memory 17 of FIG. 1, and transmits the output to the first output buffer 71b. The first output controller 77 is controlled by the main control signals NORMAL and MEMTEST. That is, when the main control signal NORMAL is active, the first output controller 77 transmits signals generated from the logic 15 of FIG. 1 to the first output buffer 71*b*, and when the main control signal MEMTEST is active, the first output controller 77 transmits signals generated from the first memory 17 of FIG. 1 to the first output buffer 71*b*.

The first output buffer controller 79 includes a third AND gate 79*a*, a first logic gate 79*c* and a first NAND gate 79*d*.

The third AND gate 79*a* receives the main control signal MEMTEST and the first output buffer enable signal TRST1. When the main control signal MEMTEST or the first output buffer enable signal TRST1 is logic low, the third AND gate 79*a* generates a logic low signal, and when both the main control signal MEMTEST and the first output buffer enable signal TRST1 are logic high, the third AND gate 79*a* generates a logic high signal.

The first logic gate 79*c* receives output of the third AND gate 79*a* and the main control signal NORMAL. When output of the third AND gate 79*a* or the main control signal NORMAL is logic high, the first logic gate 79*c* generates a logic high signal, and when the output of the third AND gate 79*a* and the main control signal NORMAL are logic low, the first logic gate 79*a* generates a logic low signal.

The first NAND gate 79*d* receives the output of the first logic gate 79*a* and a power supply voltage VCC and transmits the output to a control terminal of the first output buffer 71*b*. The first NAND gate 79*d* transmits the output of the first logic gate to the control terminal of the first output buffer 71*b*. That is, when output of the first logic gate 79*c* is logic low, the first NAND gate 79*d* generates signals of logic high, and when the output of the first logic gate 79*c* is logic high, the first NAND gate 79*d* generates signals of logic low. When the output of the first NAND gate 79*d* is logic low, i.e., active, the first output buffer 71*d* is activated, and when the output of the NAND gate 79*d* is logic high, i.e., inactive, the first output buffer 71*b* is inactive.

Figure 8:
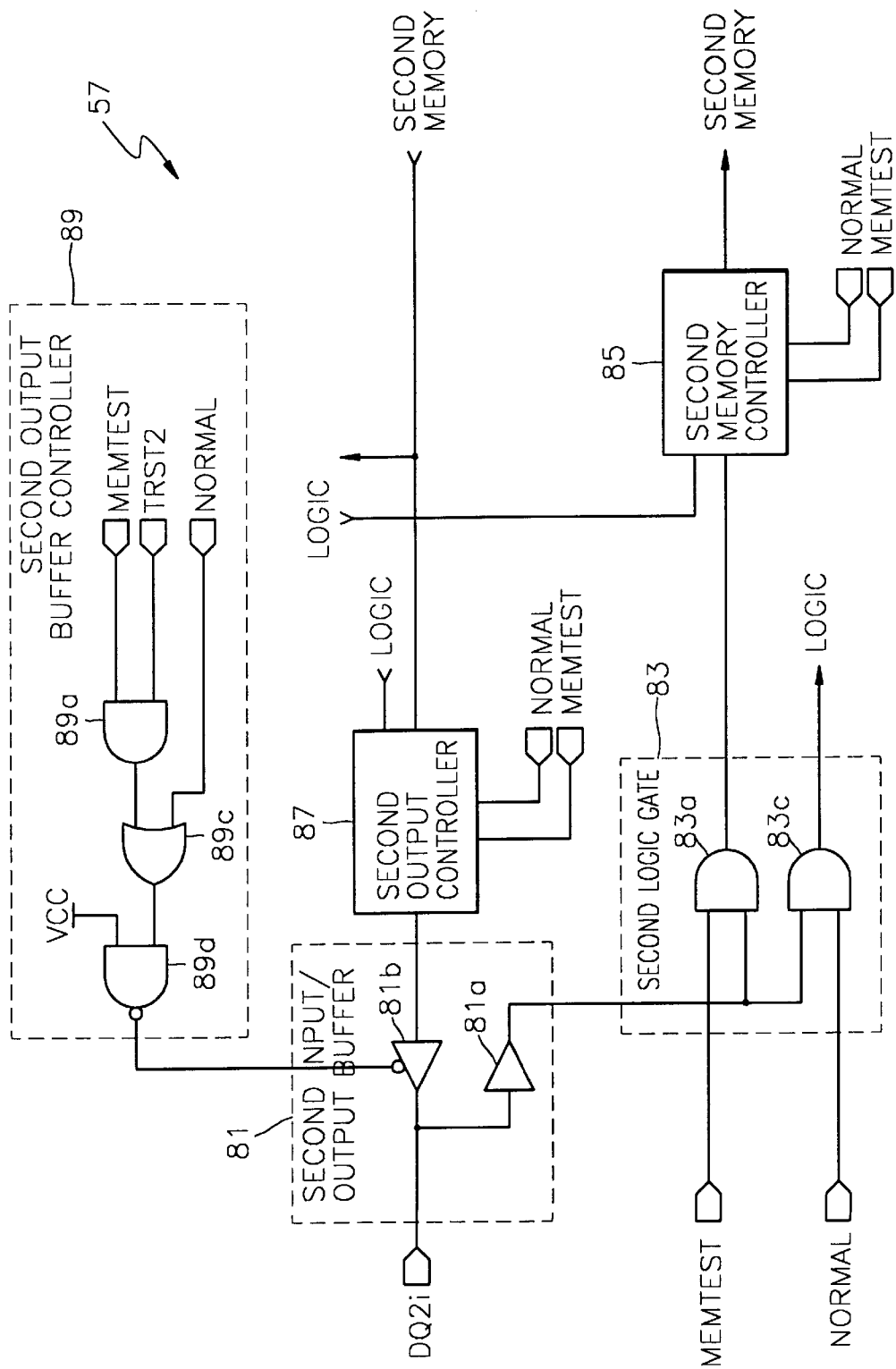
FIG. 8 is a circuit diagram of a second memory data controller of FIG. 5.

FIG. 8 is a circuit diagram of the second memory data controller 57 of FIG. 5. Referring to FIG. 8, the second memory data controller 57 includes a second input/output buffer 81, a second logic gate 83, a second memory controller 85, a second output controller 87 and a second output buffer controller 89.

The second input/output buffer 81 includes a second input buffer 81*a* and a second output buffer 81*b*.

The second input buffer 81*a* receives the memory data signal DQ2i and transmits the output to the second logic gate 83. The second input buffer 81*a* changes the voltage level of the memory data signal DQ1i. For example, a voltage of the TTL level is converted to a voltage of the CMOS level.

The second output buffer 81*b* is controlled by the second buffer controller 89 and transmits the output of the second output controller 87 externally. That is, when the output of the second output buffer controller 89 is active, the second output buffer 81*b* transmits the output of the second output controller 87 externally, and when the output of the second output buffer controller 89 is inactive, the second output buffer 81*b* is inactive, and thus the output of the second output controller 87 is not transmitted externally.

The second logic gate 83 receives the output of the second input buffer 81*a* and transmits the output to the second memory controller 85. The second logic gate 83 includes fourth and fifth AND gates 83*a* and 83*c*.

The fourth AND gate 83*a* receives the output of the second input buffer 81*a* and the main control signal MEMTEST. When the output of the second input buffer 81*a* or the main control signal MEMTEST is logic low, the fourth AND gate 83*a* generates a logic low signal, and when the output of the second input buffer 81*a* and the main control signal MEMTEST are logic high, the fourth AND gate 83*a* generates a logic high signal.

The fifth AND gate 83*c* receives the output of the second input buffer 81*a* and the main control signal NORMAL and transmits the output to the logic 15 of FIG. 1. When the output of the second input buffer 81*a* or the main control signal NORMAL is logic low, the fifth AND gate 83*c* generates a logic low signal, and when the output of the second input buffer 81*a* and the main control signal NORMAL are logic high, the fifth AND gate 83*c* generates a logic high signal.

The second memory controller 85 includes a 2-input, 1-output multiplexer. The second memory controller 85 receives the output of the fourth AND gate 83*a* and the output of the logic 15 of FIG. 1, and is controlled by the main control signals NORMAL and MEMTEST to transmit the output of the fourth AND gate 83*a* or the output of the logic 15 of FIG. 1 to the second memory 19 of FIG. 1. That is, when the main control signal NORMAL is active, the second memory controller 85 transmits signals generated from the logic 15 of FIG. 1 to the second memory 19 of FIG. 1, and when the main control signal MEMTEST is active, the second memory controller 85 transmits signals generated from the fourth AND gate 83*a* to the second memory 19 of FIG. 1.

The second output controller 87 includes a 2-input, 1-output multiplexer. The second output controller 87 receives signals generated from the logic 15 of FIG. 1 and the second memory 19 of FIG. 1, and transmits the output to the second output buffer 81*b*. The second output controller 87 is controlled by the main control signals NORMAL and MEMTEST. That is, when the main control signal NORMAL is active, the second output controller 87 transmits signals generated from the logic 15 of FIG. 1 to the second output buffer 81*b*, and when the main control signal MEMTEST is active, the second output controller 87 transmits signals generated from the second memory 19 of FIG. 1 to the second output buffer 81*b*.

The second output buffer controller 89 includes a sixth AND gate 89*a*, a second logic gate 89*c* and a second NAND gate 89*d*.

The sixth AND gate 89*a* receives the main control signal MEMTEST and the output buffer enable signal TRST1 generated from the second memory 19 of FIG. 1. When the main control signal MEMTEST or the output buffer enable signal TRST2 is logic low, the sixth AND gate 89*a* generates a logic low signal, and when both the main control signal MEMTEST and the output buffer enable signal TRST1 are logic high, the sixth AND gate 89*a* generates a logic high signal.

The second logic gate 89*c* receives the output of the sixth AND gate 89*a* and the main control signal NORMAL. When the output of the sixth AND gate 89*a* or the main control signal NORMAL is logic high, the second logic gate 89*c* generates a logic high signal, and when both the output of the sixth AND gate 89*a* and the main control signal NORMAL are logic low, the second logic gate 89*c* generates a logic low signal.

The second NAND gate 89*d* receives the output of the second logic gate 89*c* and a power supply voltage VCC and transmits the output to a control terminal of the second output buffer 81*b*. The second NAND gate 89*d* transmits the output of the second logic gate to the control terminal of the second output buffer 81*b*. That is, when the output of the second logic gate 89c is logic low, the second NAND gate 89d generates signals of logic high, and when the output of the second logic gate 89c is logic high, the second NAND gate 89d generates a logic low signal. When the output of the second NAND gate 89d is logic low, i.e., active, the second output buffer 81b is activated, and when the output of the NAND gate 89d is logic high, i.e., inactive, the second output buffer 81b is inactive.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A merged memory and logic (MML) integrated circuit comprising:

a memory block;

a logic block;

a first pad which receives memory control signals to control the memory block;

a second pad which receives memory data signals for the memory block; and means for bypassing the logic block by transmitting the memory control signals from the first pad and the memory data signals from the second pad to the memory block in response to a test control signal that indicates a test mode for the MML integrated circuit, and for transmitting the memory control signals from the first pad and the memory data signals from the second pad to the logic block in response to a test control signal that indicates a normal operation mode for the MML integrated circuit such that the memory control signals and the memory data signals are provided to the memory block via the logic block in the normal operation mode.

2. A merged memory and logic (MML) integrated circuit according to claim 1 wherein the MML integrated circuit comprises a plurality of memory blocks and wherein the bypassing means comprises:

means for generating a first control signal to indicate a test of a first one of the plurality of memory blocks, for generating a second control signal to indicate a test of a second one of the plurality of memory blocks, and for generating a third control signal to indicate the normal operation mode for the MML integrated circuit, in response to the test control signal;

first means for controlling the first and second memory blocks and the logic block, to transmit the memory control signals from the first pad to the first memory block in response to the first control signal, to transmit the memory control signals from the first pad to the second memory block in response to the second control signal, and to transmit the memory control signals from the first pad to the logic block in response to the third control signal; and second means for controlling the first and second memory blocks and the logic block, to transmit the memory data signals from the second pad to the first memory block in response to the first control signal, to transmit the memory data signals from the second pad to the second memory block in response to the second control signal, and to transmit the memory data signals from the second pad to the logic block in response to the third control signal.

3. A merged memory and logic (MML) integrated circuit comprising:

first and second memories;

a logic block;

a first pad which receives memory control signals to control the first and second memories;

a second pad which receives memory data signals for the first and second memories; and a memory test control circuit connected to the first pad, the second pad, the logic block and the first and second memories, that bypasses the logic block by transmitting the memory control signals and the memory data signals to the first and second memories when the first and second memories are tested and that transmits the memory control signals and the memory data signals to the logic block during normal operation of the MML integrated circuit such that the memory control signals and the memory data signals are provided to the memory block via the logic block in the normal operation mode.

4. The merged memory and logic (MML) integrated circuit of claim 3, wherein the memory test control circuit comprises:

a memory control signal controller that transmits the memory control signals from the first pad to the first and second memories and to the logic block;

a memory data controller that transmits the memory data signals from the second pad to the first and second memories and the logic block and that transmits memory data signals generated from the first and second memories and the logic block to the second pad; and a main control signal generator connected to the memory control signal controller and to the memory data controller, that generates main control signals to control transmission of the memory control signals to the first and second memories and to the logic block in response to a test control signal, to control transmission of the memory data signals to the first and second memories and the logic block, and to control transmission of the memory data signals generated from the first and second memories and the logic block to the second pad.

5. The merged memory and logic (MML) integrated circuit of claim 4, wherein the memory data controller comprises:

an input/output buffer to which the memory data signals are applied;

a logic gate that receives the output of the input/output buffer and the main control signals and transmits an output to the logic block;

a memory controller that receives the output of the logic gate and the output of the logic block and transmits the output of the logic gate or the output of the logic block to the first and second memories, in response to the main control signals;

an output controller that receives memory data signals generated by the first and second memories and the output of the logic block and transmits the memory data signals generated by the first and second memories or the output of the logic block to the input/output buffer, in response to the main control signals; and an output buffer controller that receives the main control signals and memory data signals generated by the first and second memories, transmits the output to the input/output buffer, and passes the output of the output controller through the input/output buffer when the output is active, and does not pass the output of the output controller through the input/output buffer when the output is inactive.

6. The merged memory and logic (MML) integrated circuit of claim 5, wherein the input/output buffer comprises:
   an input buffer that transmits the memory data signal to the logic gate; and
   an output buffer that transmits the output of the output controller externally, in response to the output buffer controller.

7. The merged memory and logic (MML) integrated circuit of claim 5, wherein the logic gate comprises:
   a fourth AND gate that receives the output of the input/output buffer and a first main control signal, transmits the output of the buffer to the memory controller when the first main control signal is logic high, and blocks the output of the buffer when the first main control signal is logic low;
   a fifth AND gate that receives the output of the buffer and a second main control signal, transmits the output of the buffer to the logic block when the second main control signal is logic high, and blocks the output of the buffer when the second main control signal is logic low; and
   a sixth AND gate that receives the output of the buffer and a third main control signal, transmits the output of the buffer to the memory controller when the third main control signal is logic high, and blocks the output of the buffer when the third main control signal is logic low.

8. The merged memory and logic (MML) integrated circuit of claim 5, wherein the memory controller comprises:
   a third multiplexer that receives the output of the logic and the output of the logic gate and transmits the output of the logic and the output of the logic gate to the first memory, in response to the main control signals; and
   a fourth multiplexer that receives the output of the logic and the output of the logic gate and transmits the output of the logic and the output of the logic gate to the second memory, in response to the main control signals.

9. The merged memory and logic (MML) integrated circuit of claim 5, wherein the output controller is a multiplexer that receives the memory data signals generated by the first and second memories and the output of the logic, and transmits the memory data signals generated by the first and second memories and the output of the logic, in response to the main control signals.

10. The merged memory and logic (MML) integrated circuit of claim 5, wherein the output buffer controller comprises:
    a first logic gate that receives the main control signals to control the first and second memory units;
    a second logic gate that receives the memory data signals generated by the first and second memory units;
    a seventh AND gate that receives the outputs of the first and second logic gates;
    a third logic gate that receives the output of the seventh AND gate and the main control signals for controlling the logic; and
    a NAND gate that receives the output of the third logic gate and a power supply voltage and transmits the output to the input/output buffer.

11. The merged memory and logic (MML) integrated circuit of claim 4, wherein the main control signal generator activates the memory main control signal when the test control signal is active and activates the logic main control signal when the test control signal is inactive.

12. The merged memory and logic (MML) integrated circuit of claim 4, wherein the memory control signal controller comprises:
    a buffer that receives the memory control signals;
    a logic gate that receives the output of the buffer, a memory main control signal and a logic main control signal, and transmits an output to the logic block; and
    a memory controller that receives the output of the logic gate and the output of the logic block, and transmits the output of the logic gate or the output of the logic block to the first and second memories, in response to the memory main control signal and the logic main control signal.

13. The merged memory and logic (MML) integrated circuit of claim 12, wherein the logic gate comprises:
    a first AND gate that receives the output of the buffer and the memory main control signal, transmits the output of the buffer to the memory controller when the memory main control signal is logic high, and blocks the output of the buffer when the memory main control signal is logic low;
    a second AND gate that receives the output of the buffer and the logic main control signal, transmits the output of the buffer to the logic block when the logic main control signal is logic high, and blocks the output of the buffer when the logic main control signal is logic low; and
    a third AND gate that receives the output of the buffer and the memory main control signal, transmits the output of the buffer to the memory controller when the memory main control signal is logic high, and blocks the output of the buffer when the memory main control signal is logic low.

14. The merged memory and logic (MML) integrated circuit of claim 12, wherein the memory controller comprises:
    a first multiplexer that receives the output of the logic block and the output of the logic gate and transmits the output of the logic block and the output of the logic gate to the first memory, in response to the memory main control signal and the logic main control signal; and
    a second multiplexer that receives the output of the logic block and the output of the logic gate and transmits the output of the logic block and the output of the logic gate to the second memory, in response to the memory main control signal and the logic main control signal.

15. The merged memory and logic (MML) integrated circuit of claim 4, wherein the memory control signal controller comprises:
    a buffer that receives the memory control signals from the first pad;
    a logic gate that receives the output of the buffer and the main control signals and transmits an output to the logic block; and
    a memory controller that receives the output of the logic gate and the output of the logic block, and transmits the output of the logic gate and the output of the logic block to the first and second memories, in response to the main control signals.

16. The merged memory and logic (MML) integrated circuit of claim 15, wherein the logic gate comprises:
    a first AND gate that receives the output of the buffer and a first main control signal from the main control signal generator, transmits the output of the buffer to the memory controller when the first main control signal is logic high, and blocks the output of the buffer when the first main control signal is logic low;

a second AND gate that receives the output of the main control signal and a second main control signal from the main control signal generator, transmits the output of the buffer to the logic when the second main control signal is logic high, and blocks the output of the buffer when the second main control signal is logic low; and a third AND gate that receives the output of the buffer and a third main control signal from the main control signal generator, transmits the output of the buffer to the memory controller when the third main control signal is logic high, and blocks the output of the buffer when the third main control signal is logic low.

17. The merged memory and logic (MML) integrated circuit of claim 15, wherein the memory controller comprises:

a first multiplexer that receives the output of the logic block and the output of the logic gate and transmits the output of the logic block or the output of the logic gate to the first memory unit, in response to the main control signals; and a second multiplexer that receives the output of the logic block and the output of the logic gate, and transmits the output of the logic block or the output of the logic gate to the second memory unit, in response to the main control signals.

18. The merged memory and logic (MML) integrated circuit of claim 3, wherein the memory test control circuit comprises:

a main control signal generator that generates a main control signal in response to an external test control signal;

a memory control signal controller that transmits the memory control signals to the first and second memories and the logic block in response to the main control signal;

a first memory data controller that transmits the memory data signals from the first pad to the first memory and the logic block or the memory data signals from the first memory and the logic to the first pad in response to the main control signal; and a second memory data controller that transmits the memory data signals from the first pad to the first memory and the logic block or the memory data signals from the second memory and the logic to the first pad in response to the main control signal.

19. The merged memory and logic (MML) integrated circuit of claim 18, wherein the first memory data controller comprises:

a first input/output buffer to which the memory data signals are applied;

a first logic gate that receives the output of the first input/output buffer, the memory main control signal and the logic main control signal and transmits an output to the logic;

a first memory controller that receives the output of the first logic gate and the output of the logic block, and transmits the output of the first logic gate or the output of the logic block to the first memory, in response to the memory main control signal and the logic main control signal;

a first output controller that receives memory data signals generated by the first memory and the output of the logic block and transmits memory data signals generated by the first memory or the output of the logic block to the first input/output buffer, in response to the memory main control signal and the logic main control signal; and a first output buffer controller that receives the memory main control signal, the logic main control signal and the memory data signals generated by the first memory unit and transmits the output to the first input/output buffer;

wherein the output of the first output controller passes through the first input/output buffer when the output of the first output buffer controller is active, and the output of the first output controller does not pass through the first input/output buffer when the output of the first output buffer controller is inactive.

20. The merged memory and logic (MML) integrated circuit of claim 19, wherein the first input/output buffer comprises:

a first input buffer that transmits the memory data signal to the first logic gate; and a first output buffer that transmits the output of the first output controller externally, in response to the first output buffer controller.

21. The merged memory and logic (MML) integrated circuit of claim 19, wherein the first logic gate comprises:

a first AND gate that receives the output of the first input/output buffer and the memory main control signal, transmits the output of the first input/output buffer to the first memory controller when the memory main control signal is transmitted, and blocks the output of the first input/output buffer when the memory main control signal is logic low; and a second AND gate that receives the output of the first input/output buffer and the main control signal, transmits the output of the first input/output buffer to the logic block when the main control signal is logic high, and blocks the output of the first input/output buffer when the main control signal is logic low.

22. The merged memory and logic (MML) integrated circuit of claim 19, wherein the first memory controller is a multiplexer that receives the output of the logic block and the output of the first logic gate and transmits the output of the logic block and the output of the first logic gate, in response to the memory main control signal and the logic main control signal.

23. The merged memory and logic (MML) integrated circuit of claim 19, wherein the first output controller is a multiplexer that receives the memory data signals generated by the first memory unit and the output of the logic block and transmits the memory data signals generated by the first memory or the output of the logic block to the first input/output buffer, in response to the memory main control signal and the logic main control signal.

24. The merged memory and logic (MML) integrated circuit of claim 19, wherein the first output buffer controller comprises:

a third AND gate that receives the memory main control signal and memory data signals generated from the first memory unit;

a first logic gate that receives the output of the third AND gate and the main control signal; and a first NAND gate that receives the output of the first logic gate and a power supply voltage.

25. The merged memory and logic (MML) integrated circuit of claim 18, wherein the second memory data controller comprises:

a second input/output buffer to which the memory data signals are applied;

a second logic gate that receives the output of the second input/output buffer, the memory main control signal and the logic main control signal, and transmits an output to the logic block;

a second memory controller that receives the output of the second logic gate and the output of the logic block and transmits the output of the second logic gate or the output of the logic block to the second memory, in response to the memory main control signal and the logic main control signal;

a second output controller that receives memory data signals generated from the second memory and the output of the logic block, and transmits the memory data signals generated from the second memory unit or the output of the logic block to the second input/output buffer, in response to the memory main control signal and the logic main control signal; and a second output buffer controller that receives the memory main control signal, the logic main control signal and the memory data signal generated from the second memory input/output buffer;

wherein the output of the second output controller passes through the second input/output buffer when the output of the second output buffer controller is active, and the output of the second output controller does not pass through the second input/output buffer when the output of the second output buffer controller is inactive.

26. The merged memory and logic (MML) integrated circuit of claim 25, wherein the second input/output buffer comprises:

a second input buffer that transmits the memory data signal to the second logic gate; and a second output buffer that transmits the output of the second output controller externally, in response to the second output buffer controller.

27. The merged memory and logic (MML) integrated circuit of claim 25, wherein the second logic gate comprises:

a fourth AND gate that receives the output o the second input/output buffer and the memory main control signal, transmits the output of the second input/output buffer to the second memory controller when the memory main control signal is logic high, and blocks the output of the second input/output buffer when the memory main control signal is logic low; and a fifth AND gate that receives the output of the second input/output buffer and the main control signal, transmits the output of the second input/output buffer to the logic when the main control signal is logic high, and blocks the output of the second input/output buffer when the main control signal is logic low.

28. The merged memory and logic (MML) integrated circuit of claim 25, wherein the second memory controller is a multiplexer that receives the output of the logic block and the output of the second logic gate and transmits the output of the logic and the output of the second logic gate to the memory, in response to the memory main control signal and the logic main control signal.

29. The merged memory and logic (MML) integrated circuit of claim 25, wherein the second output controller is a multiplexer that receives the memory data signals generated from the second memory unit and the output of the logic, and transmits the memory data signals generated from the second memory or the output of the logic to the second input/output buffer, in response to the memory main control signal and the logic main control signal.

30. The merged memory and logic (MML) integrated circuit of claim 25, wherein the second output buffer controller comprises:

a sixth AND gate that receives the memory main control signal and the memory data signal generated from the second memory unit;

a second logic gate that receives the output of the sixth AND gate and the main control signal; and a second NAND gate that receives the output of the second logic gate and a power supply voltage.

31. The merged memory and logic (MML) integrated circuit of claim 30, wherein the memory blocks are DRAM's.

32. A method of operating a merged memory and logic (MML) integrated circuit including a memory block, a logic block, a first pad which receives memory control signals to control the memory block and a second pad which receives memory data signals for the memory block, the operating method comprising the steps of:

bypassing the logic block by transmitting the memory control signals from the first pad and the memory data signals from the second pad to the memory block in response to a test control signal that indicates a test mode for the MML integrated circuit; and transmitting the memory control signals from the first pad and the memory data signals from the second pad to the logic block in response to a test control signal that indicates a normal operation mode for the MML integrated circuit such that the memory control signals and the memory data signals are provided to the memory block via the logic block in the normal operation mode.

33. A method according to claim 32 wherein the MML integrated circuit comprises a plurality of memory blocks, the method further comprising the step of:

generating a first control signal to indicate a test of a first one of the plurality of memory blocks, a second control signal to indicate a test of a second one of the plurality of memory blocks, and a third control signal to indicate the normal operation mode for the MML integrated circuit, in response to the test control signal; and wherein the transmitting step comprise the steps of:
controlling the first and second memory blocks and the logic block, to transmit the memory control signals from the first pad to the first memory block in response to the first control signal, to transmit the memory control signals from the first pad to the second memory block in response to the second control signal, and to transmit the memory control signals from the first pad to the logic block in response to the third control signal; and controlling the first and second memory blocks and the logic block, to transmit the memory data signals from the second pad to the first memory block in response to the first control signal, to transmit the memory data signals from the second pad to the second memory block in response to the second control signal, and to transmit the memory data signals from the second pad to the logic block in response to the third control signal.

* * * * *